United States Patent
Kurihara

(10) Patent No.: US 6,731,703 B2
(45) Date of Patent: May 4, 2004

(54) RECEPTION POWER LEVEL CALCULATING CIRCUIT AND RECEIVER USING THE SAME

(75) Inventor: Kazuhiro Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 623 days.

(21) Appl. No.: 09/731,903

(22) Filed: Dec. 8, 2000

(65) Prior Publication Data

US 2001/0003536 A1 Jun. 14, 2001

(30) Foreign Application Priority Data

Dec. 8, 1999 (JP) .......................................... 11-348264

(51) Int. Cl.$^7$ ............................................. H04L 27/08
(52) U.S. Cl. ..................................... 375/345; 455/234.1
(58) Field of Search ................................. 375/345, 346, 375/227, 278, 284, 285; 455/232.1, 234.1, 234.2, 235.1, 236.1, 239.1, 240.1, 241.1, 246.1, 247.1, 250.1, 251.1, 253.2, 296

(56) References Cited

U.S. PATENT DOCUMENTS

| | | | | |
|---|---|---|---|---|
| 4,872,206 A | * | 10/1989 | Graziadei et al. | ......... 455/241.1 |
| 5,884,152 A | * | 3/1999 | Matsumoto | .............. 455/234.1 |
| 6,049,361 A | * | 4/2000 | Kim | ........................... 348/678 |
| 6,148,189 A | * | 11/2000 | Aschwanden | ............ 455/234.1 |
| 6,389,272 B1 | * | 5/2002 | Horigome et al. | ....... 455/234.1 |
| 6,408,168 B1 | * | 6/2002 | Sessink | .................... 455/250.1 |
| 6,556,636 B1 | * | 4/2003 | Takagi | ......................... 375/350 |
| 2002/0068540 A1 | * | 6/2002 | Skarman et al. | ......... 455/232.1 |

FOREIGN PATENT DOCUMENTS

| | | |
|---|---|---|
| FR | 0 657 997 A1 | 6/1995 |
| JP | 62-220014 | 9/1987 |
| JP | 9-186735 | 7/1997 |
| JP | 2001-57513 | 2/2000 |
| JP | 2000-252868 | 9/2000 |
| JP | 2001-111523 | 4/2001 |

* cited by examiner

Primary Examiner—Phoung Phu
(74) Attorney, Agent, or Firm—Whitham, Curtis & Christofferson, PC

(57) ABSTRACT

Power level calculating circuit 10 and 11 calculate power levels at the input and output terminals, respectively, of a channel filter 6, and an adder 13 computes the difference between the two calculated power levels. An adder 13 corrects (i.e., subtracts) the difference obtained in the adder 12 from an AGC control signal output of an integrating circuit 9, and reports the correction output as antenna terminal reception power level to a base-band circuit 7. The correction output of the adder 13 is obtained by taking the extent of attenuation outside a desired wave band in the channel filter 6, and thus corresponds to accurate antenna terminal reception power level.

12 Claims, 4 Drawing Sheets

US 6,731,703 B2

RECEPTION POWER LEVEL CALCULATING CIRCUIT AND RECEIVER USING THE SAME

BACKGROUND OF THE INVENTION

This application claims benefit of Japanese Patent Application No. 11-348264 filed on Dec. 8, 1999, the contents of which are incorporated by the reference.

The present invention relates to reception power level calculating circuits and receivers using the same and, more particularly, to reception power level calculating circuits and receivers using the same, which can be suitably used for CDMA communication system mobile stations.

FIG. 3 schematically shows the construction of a receiver having an AGC (Automatic Gain Control) function. Referring to the Figure, received signal is fed from an antenna 1 to a front terminal circuit 2. The front terminal circuit 2 comprises a duplexer, an amplifier, a band-pass filter, a down-converter, etc., and serves to remove the received signal components outside a desired frequency band and also amplify and frequency convert the received signal. The output of the front terminal circuit 2 is fed to an AGC amplifier 3. The AGC amplifier 3 controls the gain for the received signal on the basis of a control voltage corresponding to the reception power level, and feeds out its output to a demodulating circuit 4. The demodulating circuit 4 demodulates the received signal, and feeds out the demodulated signal to an A/D (analog-to-digital) converter 5. The A/D converter 5 digitally converts the analog demodulated signal, and feeds out the digital demodulated signal to a channel filter 6.

The channel filter 6 attenuates the frequency components outside the desired frequency band in the neighborhood of a desired frequency, and feeds out the attenuated signal to a succeeding base-band circuit 7. The base-band circuit 7 executes a base-band processing on the received signal, and also calculates the ratio (SIR: Signal to Interference Ratio) of the power level of desired wave in the received signal to interference frequency power level. A power level calculating circuit 10 calculates the power level of received signal from the output of the A/D converter 5, and feeds out the difference of the received signal power level from a preset reference power level. This difference corresponds to the difference between the actual level of power fed to the A/D converter 5 and a reference power level to be received. An integrating circuit 9 integrates the power level difference.

The integrating circuit 9 feeds out gain control data thus obtained for controlling the gain of the ACG amplifier 3 corresponding to the antenna terminal reception power level. A D/A converter 8 converts the gain control data to an analog control voltage for controlling the gain of the amplifier 3. It is adapted that the integrating circuit 9 reports or supplies the obtained integration data as antenna terminal reception power level to the band-pass circuit 7.

In CDMA communication system which is used for mobile communication, spread codes such as PN (Pseudo Random Noise) codes are used for the spread spectrum of communication signal, and the communication signal is recognized on the basis of such spread codes. The CDMA system features that simultaneous communication among a plurality of radio terminals or via a plurality of channels is possible at the same frequency. The CDMA system also features that the received signal can not be demodulated unless the signal is multiplied by the same spread code as spread code used on the transmitting side at the same timing as thereon, and that the received signals with different spread codes or different spread timings, i.e., communication signals from other radio units or other channel signals, are all introduced as noise into the received signal band.

A case will now be considered, in which a plurality of CDMA system mobile stations, found near and remote from the base station of mobile communication, are in communication therewith. When the mobile stations near and remote from the base station are in communication therewith at the same frequency and the same transmission power level, a problem arises, from a view of the base station receiving terminal, that the transmission power levels of the communicating mobile stations near the base station are higher than the transmission power levels of remote communicating mobile stations so that the signals transmitted from the remote mobile stations are just like buried in the signals transmitted from the near mobile stations. This problem is known as near-remote problem. In view of the above features of the CDMA system, the base station cannot correctly demodulate the transmitted signals from the remote mobile stations because of the fact that the transmitted signals contain near mobile base station signals introduced in the reception band frequency.

In the CDMA system, such near-remote problem is solved by relatively frequent, stringent and highly accurate transmission power level control. Specifically, the transmission power level control is executed to make the near mobile station transmission power level lower and the remote mobile station transmission power level higher. The same control is executed as for the transmission power level from the base station to the mobile stations. For the transmission power level control, the base-band circuit in the receiver, i.e., mobile station side, should have correct antenna terminal reception power level. Accordingly, as shown in FIG. 3, the output of the integrating circuit 9 in the AGC circuit is reported as the antenna terminal reception power level to the base-band circuit 7.

As described above, the base-band circuit 7 computes the power level of the desired frequency for transmission power level control as well as computing the received signal SIR. The computation of the desired frequency power level requires a calculation given as:

(antenna terminal reception power level)×(desired wave power level)/(full reception power level).

The antenna terminal reception power level is the full reception power level. The ratio (desired frequency power level)/(full reception power level) is obtained and known in the base-band circuit 7, and the base-band circuit 7 is thus adapted to compute the required desired frequency power level by using the antenna terminal reception power level corresponding to the AGC circuit output, which power level is reported from the integrating circuit 9.

The prior art technique shown in FIG. 3, however, has a problem that the antenna terminal reception power level reported to the base-band circuit 7 does not actually correspond to the received signal fed thereto. Therefore, the base-band circuit 7 feeds out erroneously calculated power levels of desired frequency and interference frequency as its output, and also it is impossible to obtain right transmission power level control.

The reason for this resides in that the antenna terminal reception power level reported to the base-band circuit 7 corresponds to the received signal input to the A/D converter 5 while the received signal input to the base-band circuit 7 has been reduced in power level by the power level attenuation outside the desired frequency band in the passing of the output of the A/D converter 6 through the channel filter 6. This means that the received signal inputs to the A/D converter 5 and the base-band circuit 7, respectively, are different in power level. This leads to a difference of the corresponding antenna terminal reception power level.

Another prior art technique will now be described with reference to FIG. 4. In FIG. 4, parts like those in FIG. 3 are designated by like reference numerals. In the prior art technique shown in FIG. 4, unlike the prior art technique of FIG. 3, a power level calculating circuit 11 for power level calculation to control the gain of AGC amplifier, is provided not on the input terminal side but on the output terminal side of channel filter 6.

This circuit construction, however, poses a problem of saturation of the A/D converter 5. Saturation of the converter 5 results in power level increase or swelling outside the desired frequency band, thus resulting in deterioration of adjacent channel selectivity characteristic and so forth. This is so because the gain of the AGC amplifier 3 is determined by calculating the power level of received signal having passed through the channel filter 6. As the power passes through the channel filter 6, the power level outside the desired frequency band is attenuated, resulting in power level lower than the power level of the input to the A/D converter 5. The gain of the amplifier 3 is determined on the basis of the power level having been reduced by the passage of power through the channel filter 6, and therefore an increased value of gain is set. However, saturation takes place since signal containing power outside the desired frequency band is fed to the A/D converter 5.

SUMMARY OF THE INVENTION

An object of the present invention is to provide a reception power level calculating circuit and a receiver using the same, in which the A/D converter is not saturated and permits report of accurate antenna terminal reception power level to the base-band circuit.

According to an aspect of the present invention, there is provided a reception power level calculating circuit for a receiver comprising an AGC amplifier for amplifying received signal, a demodulating circuit for demodulating the output of the AGC amplifier, an analog-to-digital converter for converting the demodulation output of the demodulating circuit to a digital signal, a filter for attenuating the digital output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit.

The AGC control reception power level calculating means includes a means for computing the output power level of the analog-to-digital converter, and a control voltage generating means for generating the control voltage on the basis of the computation output of the computing means. The attenuated power level calculating means includes a means for computing the difference between the output power levels of the filter and the analog-to-digital converter and a means for computing the difference between the computed difference and the computed result by the control reception power level calculating means.

According to another aspect of the present invention, there is provided a receiver comprising an AGC amplifier for amplifying received signal, a demodulating circuit for demodulating the output of the AGC amplifier, an analog-to-digital converter for converting the demodulation output of the demodulating circuit to a digital signal, a filter for attenuating the digital output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit.

The AGC control reception power level calculating means includes a means for computing the output power level of the analog-to-digital converter, and a control voltage generating means for generating the control voltage on the basis of the computation output of the computing means. The attenuated power level calculating means includes a means for computing the difference between the output power levels of the filter and the analog-to-digital converter. The base-band circuit receives a report from the power level correcting means and uses the received report as data for power level control with respect to the opposite side of communication. The receiver is used in a CDMA communication system mobile station.

According to other aspect of the present invention, there is provided a receiver in which received signal through an antenna is amplified by AGC amplifier, decoder, A/D converted by A/D converter, suppresses frequency band outside a desired frequency by a channel filter and the filtered output is processed by a base-band circuit, A receiver in which received signal through an antenna is amplified by AGC amplifier, decoded, and A/D converted by A/D converter, frequency band outside a desired frequency is suppressed by a channel filter and the filtered output is processed by a base-band circuit, comprising: power calculator for calculating power signal based on the digital data from the A/D converter; gain controller for determining a difference signal between the power signal and a predetermined reference level determined based on the input range of the A/D converter, integrating the difference signal, and converting the integrated difference signal to an analog signal to supply the converted analog signal to the AGC amplifier as a gain control signal; and subtracter for subtracting an attenuation power level from the integrated difference signal and supplying the subtracted signal to the base-band processor as a reference signal. The attenuation power level of the channel filter is determined by a difference between the input and output of the channel filter. The base-band processor determines SIR, i.e., ratio between the desired frequency power level contained in the received signal and interference power level and controls the transmission power level on the basis of the determined SIR. The receiver as set forth in claim 1 is a receiver in a mobile station in CDMA communication system.

The receiver using the above reception power level calculating circuit according to the present invention, can serve as a CDMA communication system mobile station. The base-band circuit features that it uses a report received from the power correcting means as data for power level control with respect to the opposite side of communication.

In operation and function according to the present invention, the received signal power level is calculated both before and after the passing of power through the channel filter provided as a stage succeeding the A/D converting circuit. It is thus possible to permit accurate antenna terminal reception power level to be reported to the base-band circuit without saturation of the A/D converting circuit.

Specifically, a first power level calculating circuit calculates the power level of received signal, which has been digitally converted in the A/D converting circuit, and thus feeds out the difference of the calculated power level from a reference power level to be received. An integrating circuit integrates the power level difference, and its integration output represents the antenna terminal reception power level and is used for controlling the AGC amplifier. Since the difference between the power level fed to the A/D converting circuit and the reference power level to be received is fed back to the AGC amplifier, the received signal input to the A/D converting circuit does not exceed the input range thereof, and no saturation of the A/D converting circuit takes place.

A second power level calculating circuit for computing the output power level of the channel filter, calculates the power level of received signal after the components outside the desired frequency band have been attenuated in the channel filter. The extent of power level attenuation in the channel filter, can be expressed by the difference of the power level calculated in the second power level calculating circuit from the power level calculated in the first power level calculating circuit. The received signal which is fed to the base-band circuit, has passed through the channel filter and is thus lower in power level than the power level fed to the A/D converter by the extent of attenuation in the channel filter. This means that the antenna terminal reception power level to be reported to the base-band circuit, should be corrected to a level, which represents the difference that is obtained by subtracting the difference between the results of calculation in the two power level calculating circuits from the result of integration in the integrating circuit. By this correction, a coincidence relation of the reception power level fed to the base-band circuit and the antenna terminal reception power level report from each other is obtainable.

Other objects and features will be clarified from the following description with reference to attached drawings.

PREFERRED EMBODIMENTS OF THE INVENTION

Preferred embodiments of the present invention will now be described with reference to the drawings.

Figure 3:
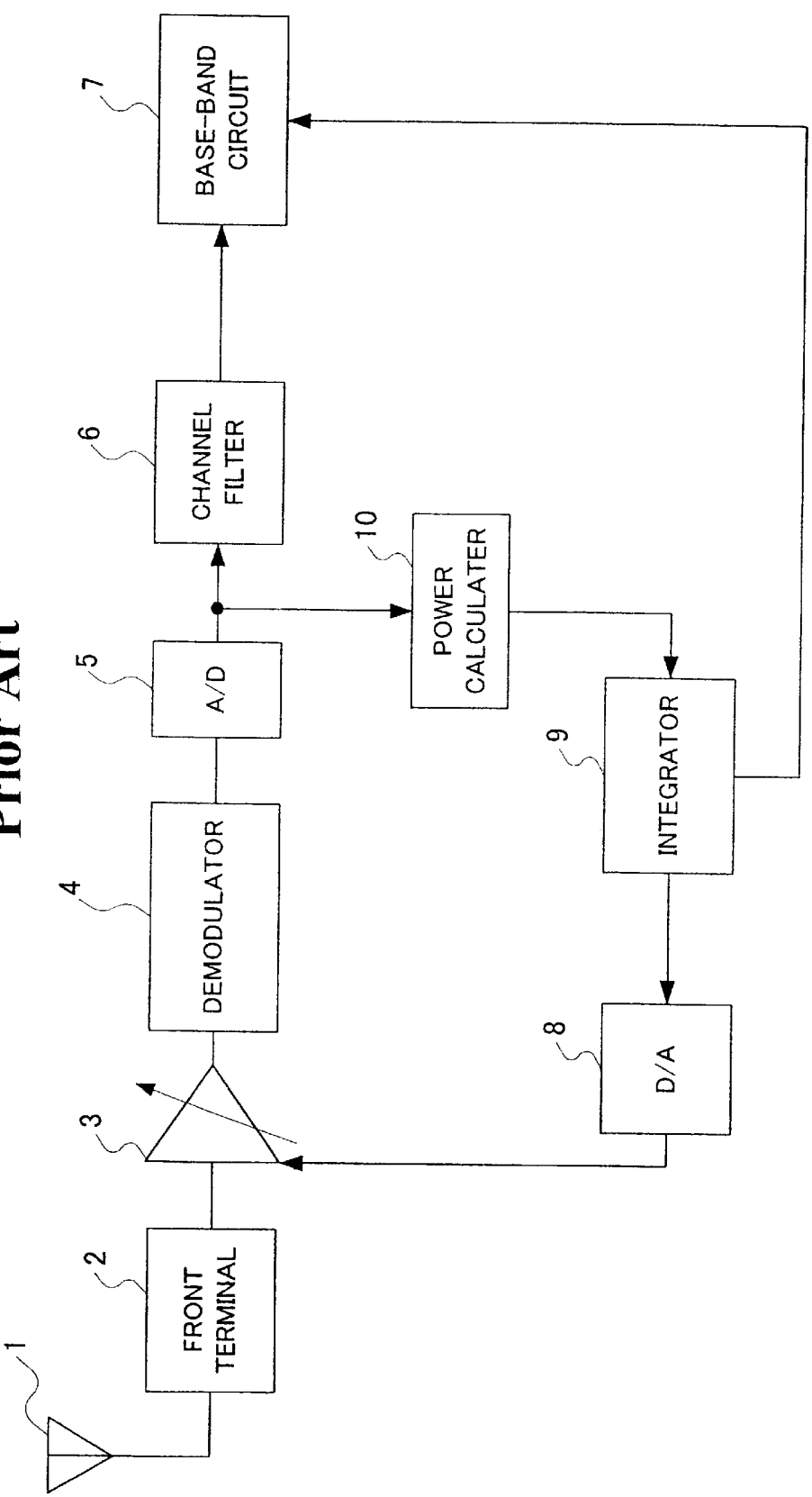
FIG. 3 schematically shows a construction of a prior art receiver having an AGC function.
Figure 4:
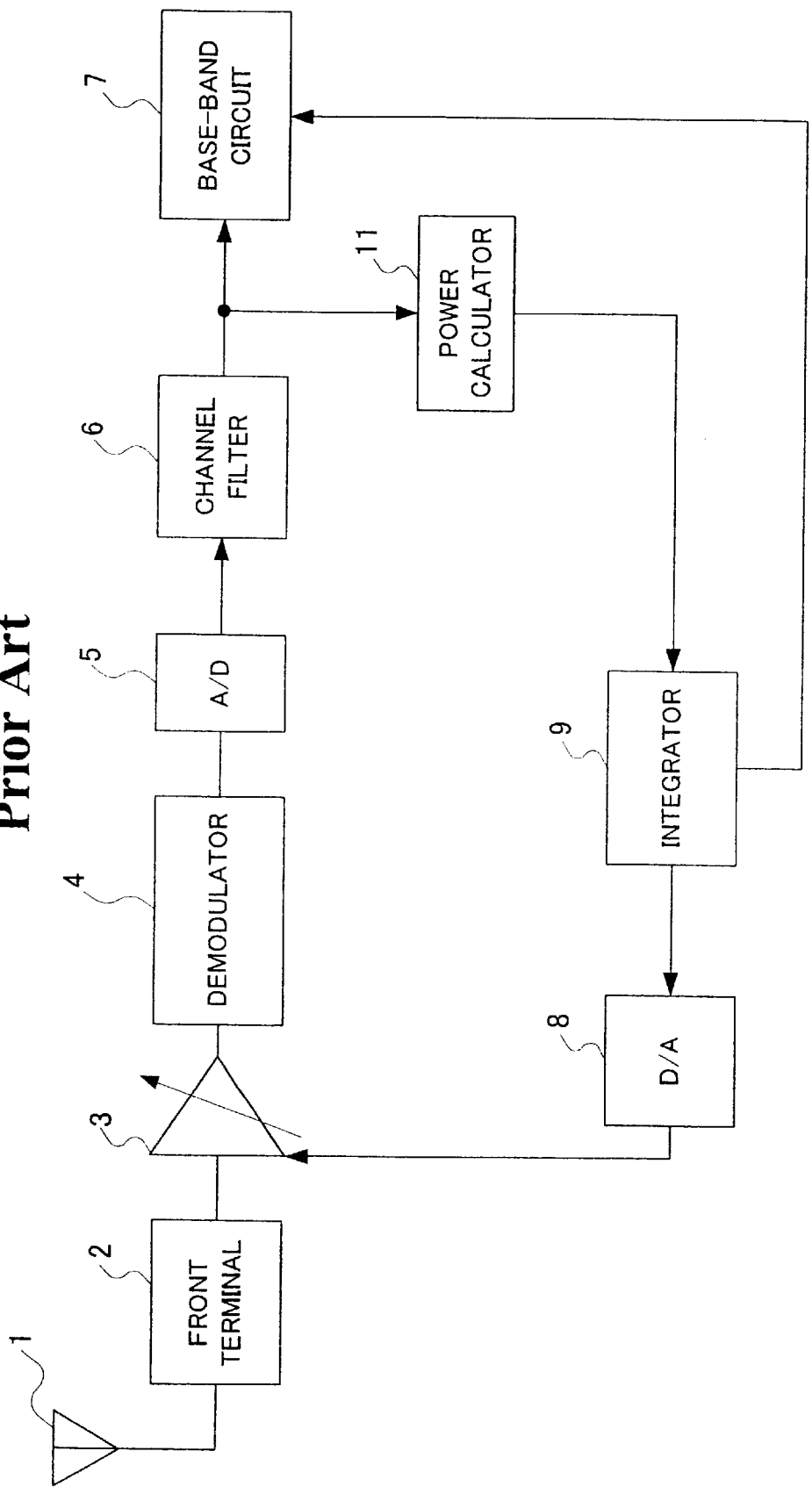
FIG. 4 schematically shows a construction of another prior art receiver having an AGC function.

Parts like those in FIGS. 3 and 4 are designated by like reference numerals. Received signal is received by an antenna 1. A front terminal circuit 2 comprises a duplexer, an amplifier, a band-pass filter, a down-converter, etc., and serves to remove received signal components outside a desired frequency band and amplify and frequency convert the received signal. An AGC amplifier 3 controls gain concerning the received signal on the basis of a control voltage corresponding to reception power level. A demodulating circuit 4 demodulates the received signal, and an A/D converter 5 digitally converts the received signal which is an analog signal. A channel filter 6 attenuates the received signal frequency components outside the desired frequency band in the neighborhood of the desired wave.

A base-band circuit 7 calculates SIR, i.e., ratio between the desired frequency power level contained in received signal and interference power level. The base-band circuit 7 also receives, from an adder 13, antenna terminal reception power level corresponding to the received signal fed to it and calculates, in addition to the SIR calculation, RSSI (Received Signal Strength Indicator), i.e., the desired frequency power level, which is used for the transmission power level control with respect to the base station as opposite side of communication noted before.

A power level calculating circuit 10 calculates received signal power level from the output of the A/D converter 5, and feeds out the difference of the calculated power level from a reference power level. This difference represents the difference between the reference power level to be received and the actual power level fed to the A/D converter 5. An integrating circuit 9 integrates the power level difference. The integration thus obtained corresponds to the antenna terminal reception power level, and is fed to the adder 13. The integrating circuit 9 feeds out the control data, corresponding to the antenna terminal reception power level, the AGC amplifier gain data through a D/A converter 8.

Another power level calculating circuit 11 calculates the power level of received signal after attenuation of power level thereof outside the desired frequency band in the channel filter 6. An adder 12 feeds out the difference of the power level calculated in the power level calculating circuit 11 from the power level calculated in the power level calculating circuit 10. This power level corresponds to the extent of power level attenuation in the channel filter 6. An adder 13 corrects the integration output of the integrating circuit 9 for the power level attenuation in the channel filter 6 by subtracting the difference output of the adder 12 from the integrating output, and reports the corrected power level to the base-band circuit 7.

Figure 1:
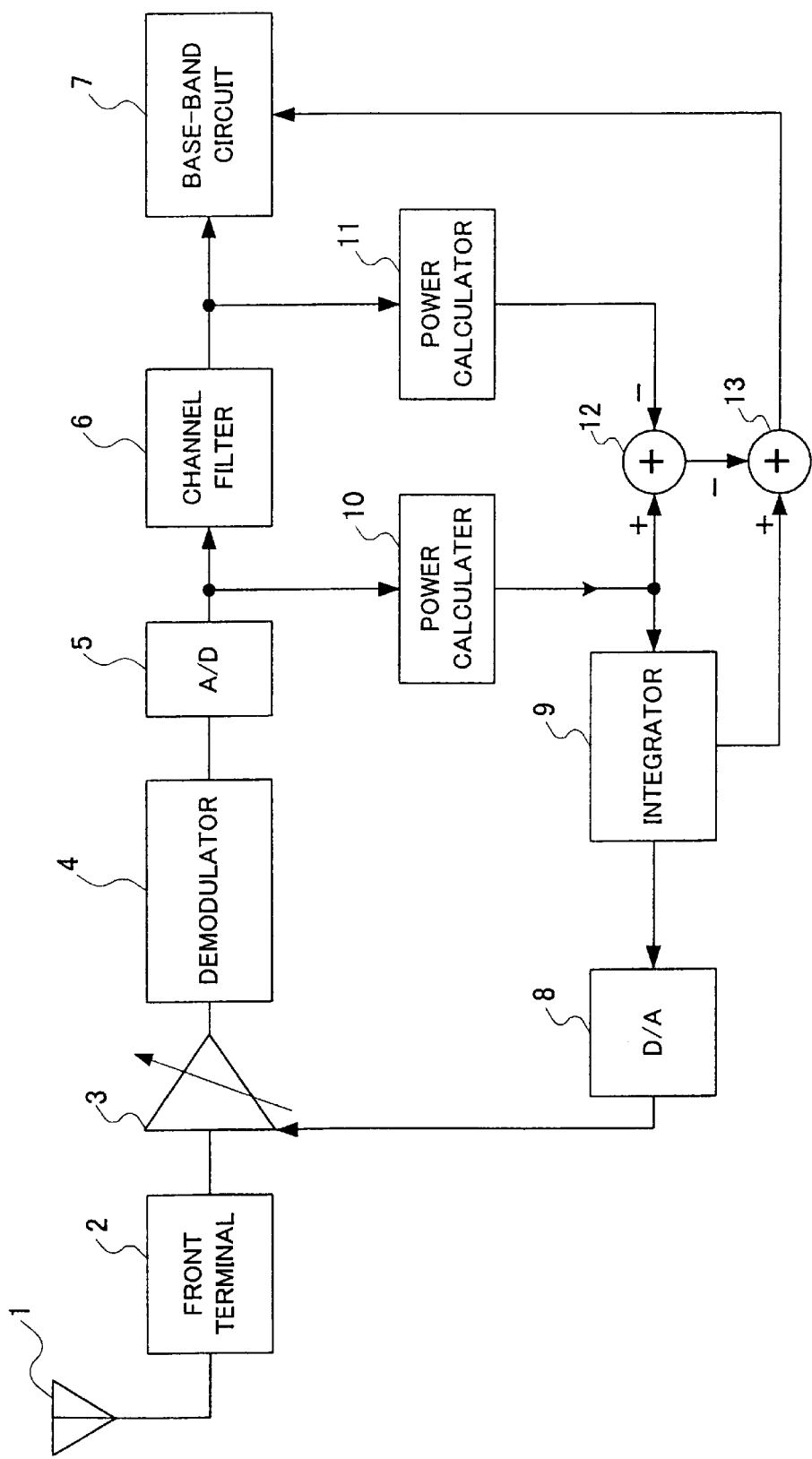
FIG. 1 schematically shows a construction of a receiver having an AGC according to the present invention.
Figure 2A:
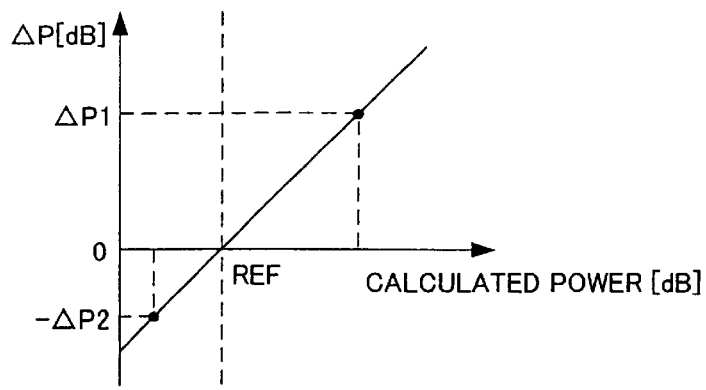
FIGS. 2A and 2B show drawings for explaining the operation of the receiver according to the present invention.
Figure 2B:
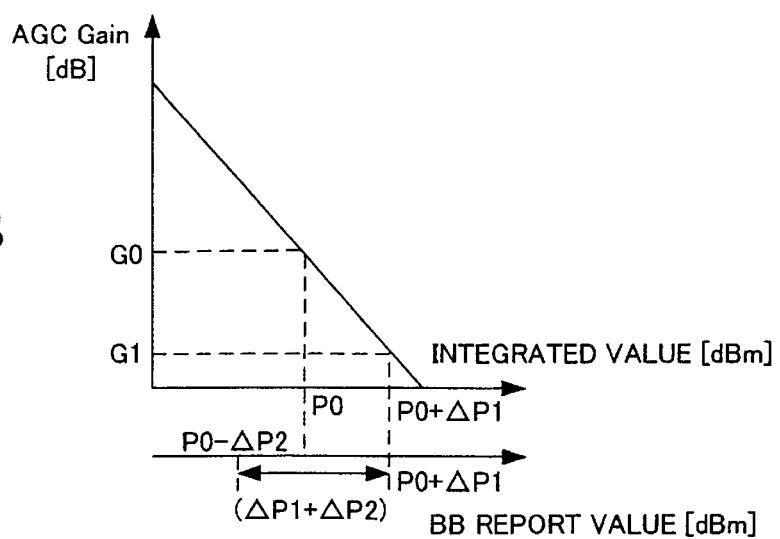

The operation of the circuit shown in FIG. 1 will now be described with reference to FIGS. 2(a) and 2(b). It is assumed that the gain of the AGC amplifier 3 shown in FIG. 1 is set to a certain value G0 for a certain fixed period of time (for instance a time slot interval). In this case, the power level calculating circuit 10 calculates an average power level in a time slot fed to the A/D converter 5. In FIG. 2(a), the abscissa is taken for the power level calculated in the power level calculating circuit, and the ordinate represents the difference between the calculated power level and a reference power level REF. The reference power level REF is calculated on the basis of the input range of the A/D converter 5.

Referring to FIG. 2A, assuming the result of power level calculation in the power level calculating circuit 10 to be Pca11, the difference ΔP1 from the reference power level REF is fed to the integrating circuit 9. In FIG. 2B, the upper abscissa is taken for the integration obtained in the integrating circuit 9, i.e., the antenna terminal reception power level as viewed from the input terminal of the A/D converter 5. The ordinate is taken for the gain of the AGC amplifier 3 which is adequate with respect to the antenna terminal reception power level. When the gain of the amplifier 3 is G0, the integration is P0.

When receiving ΔP1 from the power level calculating circuit 10, the integrating circuit 9 feeds out an integration value (P0+ΔP1), and the gain of the AGC amplifier 3 is determined to be G1. The integrating circuit 9 feeds out the control voltage data corresponding to the gain G1 of the AGC amplifier 3 to the D/A converter 8, which thus feeds out the control voltage to the AGC amplifier 3. In this way, the gain of the amplifier 3 is controlled on the basis of the received signal reception power level fed to the A/D converter 5, so that no saturation thereof takes place.

The power level calculating circuit 11 calculates the power level of received signal, which is obtained after power level attenuation outside the desired frequency band in the channel filter 6. Assuming the result of power level calculation in the power level calculating circuit 11 to be Pca12, as shown in FIG. 2(*a*), the circuit 11 feeds out the difference−ΔP2 (ΔP2 being a positive number) of Pca12 from the reference power level REF to the adder 12. As the reference power level REF, the same value is used in the two power level calculating circuits.

The adder 12 feeds out difference (ΔP1+ΔP2) of the output−ΔP2 of the power level calculating circuit 11 from the output ΔP1 of the power level calculating circuit 10. This difference represents the power level attenuation in the channel filter 6. The lower abscissa in FIG. 2(*b*) is taken for the antenna terminal reception power level that is reported to the base-band circuit 7. As shown in the lower abscissa in FIG. 2(*b*), the adder 13 subtracts the difference output (ΔP1+ΔP2) of the adder 13 from the integration output (P0+ΔP1) of the integrating circuit 9, and feeds out the output (P0−ΔP2) as antenna terminal reception power level to the base-band circuit 7.

While the received signal power level fed to the base-band circuit 7 is lower than the received signal power level fed to the A/D converter 5 by the extent corresponding to the attenuation in the channel filter 6, the report output (P0−ΔP2) of the adder 13 is a right value as antenna terminal reception power level as viewed from the input terminal of the base-band circuit 7. This is so because the report is fed out after correction by taking the power level attenuation in the filter 6 into considerations. The circuit 7 thus can calculate right power levels of desired wave and interference wave.

Thus, it is an obtainable effect of the present invention that accurate antenna terminal reception power level can be reported to the base-band circuit without saturation of the A/D converter. This is so because the AGC amplifier gain is controlled on the basis of the result of calculation of received signal power level fed to the A/D converter and also the antenna terminal reception power level is reported to the base-band circuit by calculating the power level of received signal having passed through the channel filter and correcting the calculated power level for the power level attenuation in the channel filter.

Thus, accurate level of power received from the base station as opposite side of communication at the antenna terminal, is reported to the base-band circuit in the CDMA communication system mobile station, so that the transmission power level with respect to the base station can be controlled correctly.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A reception power level calculating circuit for a receiver comprising an AGC amplifier for amplifying received signal, a demodulating circuit for demodulating the output of the AGC amplifier, an analog-to-digital converter for converting the demodulation output of the demodulating circuit to a digital signal, a filter for attenuating the digital output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit.

2. The reception power level calculating circuit according to claim 1, wherein the AGC control reception power level calculating means includes a means for computing the output power level of the analog-to-digital converter, and a control voltage generating means for generating the control voltage on the basis of the computation output of the computing means.

3. The reception power level calculating circuit according to claim 1, wherein the attenuated power level calculating means includes a means for computing the difference between the output power levels of the filter and the analog-to-digital converter and a means for computing the difference between the computed difference and the computed result by the AGC reception power level calculating means.

4. A receiver comprising: an antenna for receiving a signal, a front terminal circuit for removing received signal components outside a desired frequency band and amplify and frequency convert a received signal, an AGC amplifier for amplifying the received signal, a demodulating circuit for demodulating the output of the AGC amplifier, an analog-to-digital converter for converting the demodulation output of the demodulating circuit to a digital signal, a filter for attenuating the analog output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit.

5. The receiver according to claim 1, wherein the AGC control reception power level calculating means includes a means for computing the output power level of the analog-to-digital converter, and a control voltage generating means for generating the control voltage on the basis of the computation output of the computing means.

6. The receiver according to claim 1, wherein the attenuated power level calculating means includes a means for computing the difference between the output power levels of the filter and an analog-to-digital converter.

7. A receiver comprising an AGC amplifier for amplifying received signal, a demodulating circuit for demodulating the output of the AGC amplifier, an analog-to-digital converter for converting the demodulation output of the demodulating circuit to a digital signal, a filter for attenuating the digital output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit, wherein the base-band circuit receives a report from the power level correcting means and uses the received report as data for power level control with respect to the opposite side of communication.

8. A receiver comprising an AGC amplifier for amplifying received signal, a demodulating circuit for demodulating the output of the AGC amplifier, an analog-to-digital converter for converting the demodulation output of the demodulating circuit to a digital signal, a filter for attenuating the digital output of the analog-to-digital converter outside a desired frequency band, a base-band circuit for base-band processing the output of the filter, an AGC control reception power level calculating means for calculating a reception power level to generate a control signal for controlling the AGC amplifier, an attenuated power level calculating means for calculating the power level having been attenuated in the filter, and a power level correcting means for correcting the result of calculation in the AGC control reception power level calculating means with the result of calculation in the attenuated power level calculating means and reporting the corrected power level to the base-band circuit, which is a CDMA communication system mobile station.

9. A receiver in which received signal through an antenna is amplified by AGC amplifier, decoded, and A/D converted by A/D converter, frequency band outside a desired frequency is suppressed by a channel filter and the filtered output is processed by a base-band circuit, comprising:

power calculator for calculating power signal based on the digital data from the A/D converter;

gain controller for determining a difference signal between the power signal and a predetermined reference level determined based on the input range of the A/D converter, integrating the difference signal, and converting the integrated difference signal to an analog signal to supply the converted analog signal to the AGC amplifier as a gain control signal; and subtracter for subtracting an attenuation power level from the integrated difference signal and supplying the subtracted signal to the base-band processor as a reference signal.

10. The receiver according to claim 1, wherein the attenuation power level of the channel filter is determined by a difference between the input and output of the channel filter.

11. The receiver according to claim 1, wherein the base-band processor determine SIR, i.e., ratio between the desired frequency power level contained in the received signal and interference power level and controls the transmission power level on the basis of the determined SIR.

12. The receiver according to claim 1, wherein the receiver as set forth in claim 1 is a receiver in a mobile station in CDMA communication system.

* * * * *